United States Patent [19]
Wheatley, Jr.

[11] 3,967,207
[45] June 29, 1976

[54] AMPLIFIER WITH OVER-CURRENT PROTECTION

[75] Inventor: Carl Franklin Wheatley, Jr., Somerset, N.J.

[73] Assignee: RCA Corporation, New York, N.Y.

[22] Filed: Feb. 27, 1975

[21] Appl. No.: 553,636

Related U.S. Application Data

[63] Continuation of Ser. No. 363,600, May 24, 1973, abandoned.

[52] U.S. Cl. .............................. 330/23; 307/202 R; 330/207 P
[51] Int. Cl.² ......................................... H03F 3/04
[58] Field of Search ............ 330/207 PC, 23, 38 M; 307/202 R; 323/22 T, 22 SC, 17, 19, 20, 65; 317/33 VR

[56] References Cited
UNITED STATES PATENTS

| | | | |
|---|---|---|---|
| 3,512,097 | 5/1970 | Tyler | 330/11 |
| 3,531,730 | 9/1970 | Steckler | 330/24 |
| 3,701,004 | 10/1972 | Tuccinardi et al. | 323/22 T |
| 3,754,182 | 8/1973 | Morris et al. | 323/22 T |

OTHER PUBLICATIONS

Electronics World–June 1960, pp. 44, 45, "IC Op-Amp Hi-Fi Preamplifier by Recklinghausen."

*Primary Examiner*—James B. Mullins
*Attorney, Agent, or Firm*—H. Christoffersen; S. Cohen; A. L. Limberg

[57] ABSTRACT

PNP composite transistors connected as common-emitter amplifiers each comprise a PNP pre-amplifier transistor in direct coupled cascade with a plurality of parallelled NPN transistors. The emitter-electrode of the PNP transistor is connected to a sensing resistor in the collector path of one of these NPN transistors, causing the "base-to-emitter" potential of the composite transistor to increase if its "emitter" current exceeds a threshold current. By clamping this base-to-emitter potential if it exceeds a predetermined potential, the output current of the composite transistor is prevented from becoming excessive. This predetermined potential is controlled as a function of composite transistor temperature and supply potential to provide the required degree of over-current protection for these particular conditions.

15 Claims, 3 Drawing Figures

AMPLIFIER WITH OVER-CURRENT PROTECTION

This is a continuation of U.S. Pat. application Ser. No. 363,600 filed May 24, 1973, and now abandoned.

BACKGROUND OF THE INVENTION

This invention relates to circuitry to prevent excessive output current in composite transistors—useful, for example, in an audio-power amplifier to prevent overdissipation of an output transistor.

Over-current protection utilizing a sensing resistor in the emitter connection of a power amplifier output transistor is known. As the emitter current of the output transistor is increased in response to an increase in applied base current, a potential is developed across the resistor. By arranging to clamp the base potential of the output transistor when the potential across the resistor increases to such degree as indicates the onset of an over-current condition, the availability of base current to support additional emitter current flow is curtailed. So the power consumed by the transistor can be limited to a safe level without need for resorting to negative feedback circuits, which tend to be oscillatory under certain conditions. In the past, the potential to be developed across the sensing resistor in order that further increase of emitter current in the output transistor be forestalled has been a fixed potential. This has meant that the safe level of dissipation has had to be set lower than necessary for most operating conditions.

SUMMARY OF THE INVENTION

A principal aspect of the present invention concerns a power amplifier output transistor provided over-current protection wherein there is adjustment of the potential which must be developed across the emitter current sensing resistor in order that the base electrode of the output transistor be clamped to prevent further increase of emitter current. This adjustment is made responsive to the operating conditions (such as temperature and/or emitter-to-collector potential) of the output transistor so that the safe level of dissipation is adjusted responsive to these operating conditions. This means that the safe level of dissipation can be set to a higher level under optimum operating conditions with an attendant increase in the power to be made available from the power amplifier. However, the designer and user of the power amplifier are assured that, should unexpected by adverse operating conditions obtain, the output transistor will be adequately protected. This operating flexibility is particularly advantageous in audio power amplifiers for high-fidelity sound reproduction systems where high peak power handling capability for music is desired and where heat sinking of the output transistor is minimized to reduce weight and cost of the amplifier.

DESCRIPTION OF THE PREFERRED EMBODIMENTS

Figure 1:
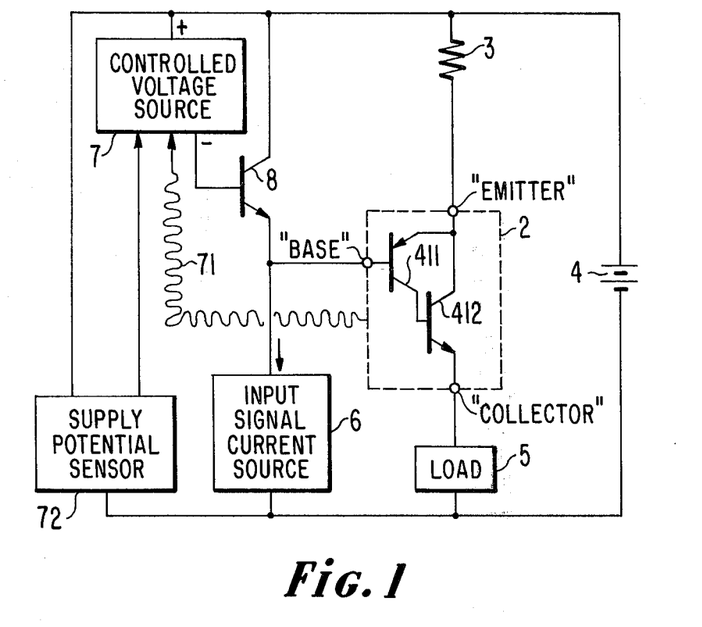
FIG. 1 is a schematic diagram, partially in block form, of a transistor means with over-current protection embodying the present invention.

FIG. 1 shows a transistor means 2 which is a composite transistor comprising a PNP transistor 411 and an NPN transistor 412. Transistor means 2 behaves like a PNP transistor with a "base" electrode at the base electrode of PNP transistor 411, with an "emitter" electrode at the interconnected emitter electrode of PNP transistor 411 and collector electrode of NPN transistor 412, and with a "collector" electrode at the emitter electrode of NPN transistor 412. This type of composite PNP transistor is oftentimes used for obtaining PNP power transistors in integrated circuitry, it being efficient of die area to do so. Since the lateral structure of a PNP transistor takes up inordinate amounts of die area as emitter-to-collector current handling capability is increased as contrasted to the area taken up by the vertical structure NPN transistor, it is most efficient to use the vertical-structure NPN transistor to multiply the current-handling capability of the lateral-structure PNP. The terms base, emitter and collector in quotation marks will be understood to refer to the functions of composite transistor electrodes as well as of simple transistors, regardless of whether these electrodes are or are not actually base, emitter and collector electrodes insofar as actual structure is concerned. That is, the terms shall be employed in the sense used by those skilled in the art of integrated circuit design.

Transistor means 2 has its emitter electrode connected by means of a current sensing resistor 3 to the positive operating terminal of a power supply, shown as battery 4. Its collector electrode is connected through a load 5 to the negative terminal of this power supply. An input signal source 6 withdraws a signal current from the base electrode of transistor means 2 to vary the conduction of current between its emitter and collector electrodes. As this latter current increases, the potential drop across the current sensing resistor 3 increases in direct proportion therewith, according to Ohm's Law.

The problem is that the input signal current from source 6 may be overly large causing the level of current flowing between the emitter and collector electrodes of transistor means 2 to be so large that the internal $I^2R$ heating of transistor means 2 exceeds its capability of dissipating this heat into space. As is well known, this causes the temperature of transistor means 2 to rise, which increases its capability to dissipate heat because of the greater difference in temperature between itself and its ambient. But, if current levels are excessive, the temperature of the transistor means 2 cannot rise sufficiently to balance the internal heat generation and dissipation capabilities of the transistor means 2, since the transistor means 2 will be harmed or even destroyed by excessive temperature before this balance can be achieved.

To prevent this deleterious condition, excessive input current is diverted from the base electrode of the transistor means 2. This can be done by arranging a unilaterally conductive element between the base electrode of the transistor means 2 and a point of potential, so as to become conductive when and only when the potential drop across current sensing resistor 3 exceeds a predetermined value. In FIG. 1 this unilaterally conductive element is shown as the base-emitter junction of a transistor 8, and controlled voltage source 7 determines the value of potential drop across resistor 3 for which the base-emitter junction of transistor 8 will become conductive. In prior art circuits the potential to which the end of the unilaterally conductive element remote from its base electrode of transistor means 2 was connected was at a fixed, predetermined potential with respect to the potential at the end of the current sensing resistor 3 remote from the emitter electrode of transistor means 2. That is, controlled voltage source 7 replaces the means providing a fixed offset potential used in the prior art.

According to a principal aspect of the present invention, controlled voltage source 7 alters the potential at which the onset of diverting input signal current from source 6 away from the base electrode of transistor means occurs responsive to the operating conditions of the transistor means 2. In this way, under less rigorous operating conditions, the emitter-to-collector current of transistor means 2 may have a higher value than under more rigorous operating conditions. This permits the maximum emitter-to-collector current to be chosen at a higher value in accordance with the expected operating conditions without incurring added risk of the transistor means 2 being injured or destroyed during some anomolous operating condition, which may be short-lived or easily corrected. The practical result can be, in effect, an amplifier with higher power handling capability under most operating conditions without need for transistor means with higher dissipation ratings or for more elaborate heat sinking of the transistor means.

More particularly, controlled voltage source 7 can be responsive to increased temperature of transistor means 2 as coupled thereto by a thermal coupling 71 to reduce the level emitter-to-collector current through transistor means 2 at which input signal current is diverted from the base electrode of transistor means 2. Alternatively, controlled voltage source 7 can be responsive to the value of supply potential as supplied by battery 4 and sensed by the supply potential sensor 72 to limit the maximum emitter-to-collector potential of transistor means 2 in inverse proportion to the supply potential over a certain range to keep the dissipation level from transistor means 2 at which over-current protection is afforded fairly constant. Or the controlled voltage source 7 can inhibit substantially all current flow in transistor means 2 until supply potential reaches a certain value. The controlled voltage 7 can also be responsive to combinations of these operating conditions, as arranged for in the amplifier of FIG. 3 and discussed in detail hereinafter.

Figure 2:
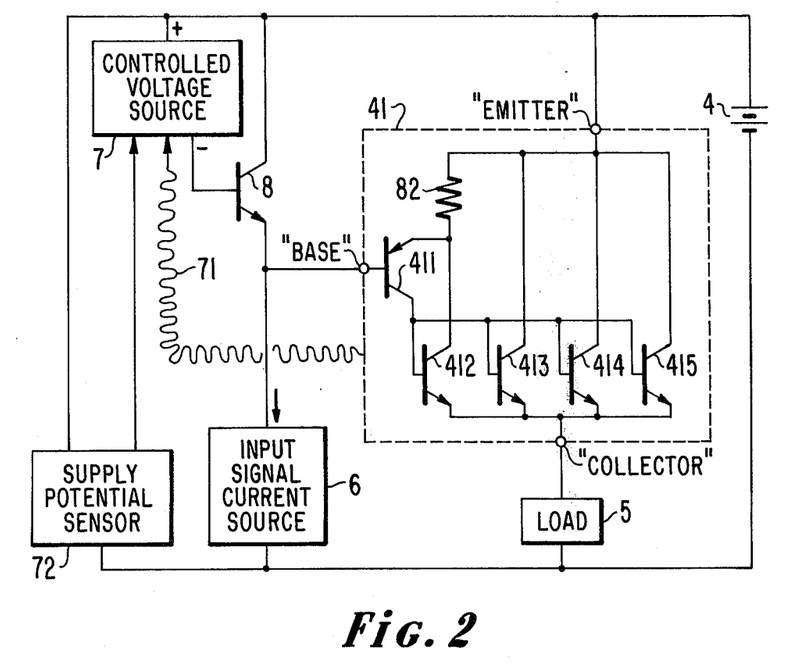
FIG. 2 is a schematic diagram, partially in block form, of a first transistor means with over-current protection embodying the present invention, wherein the over-current protection is extended to additional transistor means operated in parallel with said first transistor means.

FIG. 2 shows a transistor means 41 afforded over-current protection similar in many respects to that afforded to transistor means 2 in FIG. 1. The primary difference between the over-current protection circuits is in the manner in which the current sensing resistor 82 is inserted in composite transistor 41. In composite PNP transistors used to handle appreciable output currents—say, of more than a few milliamperes—it is common practice in integrated circuitry to use a structure comprising several parallelled transistors to share the current flow in the composite device between them. Were resistor 82 replaced by direct connection in composite transistor 41, it would resemble this prior art device.

Suppose instead of resistor 82 being used, the emitter electrodes of component PNP transistors 411 and all the collector electrodes of the component NPN transistors 412, 413, 414, 415 were directly connected to the emitter electrode of composite transistor 41. Suppose further that composite transistor 41 were provided with a current sensing resistor 3 carrying its entire emitter current, just as the composite transistor 2 is in FIG. 1. The resistance of this current sensing resistor will have to be a fraction of an ohm in designs where the emitter currents are in the few ampere range. Such low-value resistors cannot be successfully integrated as diffused resistors, since they would take up too large an area on the integrated circuit die. Also, problems arise with the contact resistance associated with ohmic contact between circuit metallization and semiconductive material in the resistors or transistors appreciably affecting the value of low value resistors.

Similar fractions of the emitter current of the PNP composite transistor 41 are provided by the collector currents of each of its component NPN transistors. (The contribution of the emitter current of PNP component transistor 411 normally may be neglected since it is smaller by the beta, or common-emitter forward current gain, of the NPN component transistors.) Now, suppose the current in only one of the collector current paths of transistors 412, 413, 414, 415 flows through the current-sensing resistor 82 as actually shown in FIG. 2. The resistance of current-sensing resistor 82 can be larger by a factor equal to the ratio of the currents in the other collector current paths as compared to the current through itself, yet the same potential is developed thereacross as across a current-sensing resistor 3 through which all the emitter current of the composite transistor would flow.

So, another aspect of the present invention, which is of great practical importance where a composite transistor incorporating a plurality of parallelled transistors is used, is to sense the current flow in the parallelled transistors by means of a current-sensing resistor 82 which samples the current flow in the transistors. That is, the current-sensing resistor does not pass the current flows of all the parallelled transistors but only the current flow through a fraction of them. This permits the resistance of the current sensing resistor 82 to be made larger than the resistance of a current sensing resistor 3 passing the current flows of all the parallelled transistors, and therefore to be of a practicably integrable value.

Figure 3:
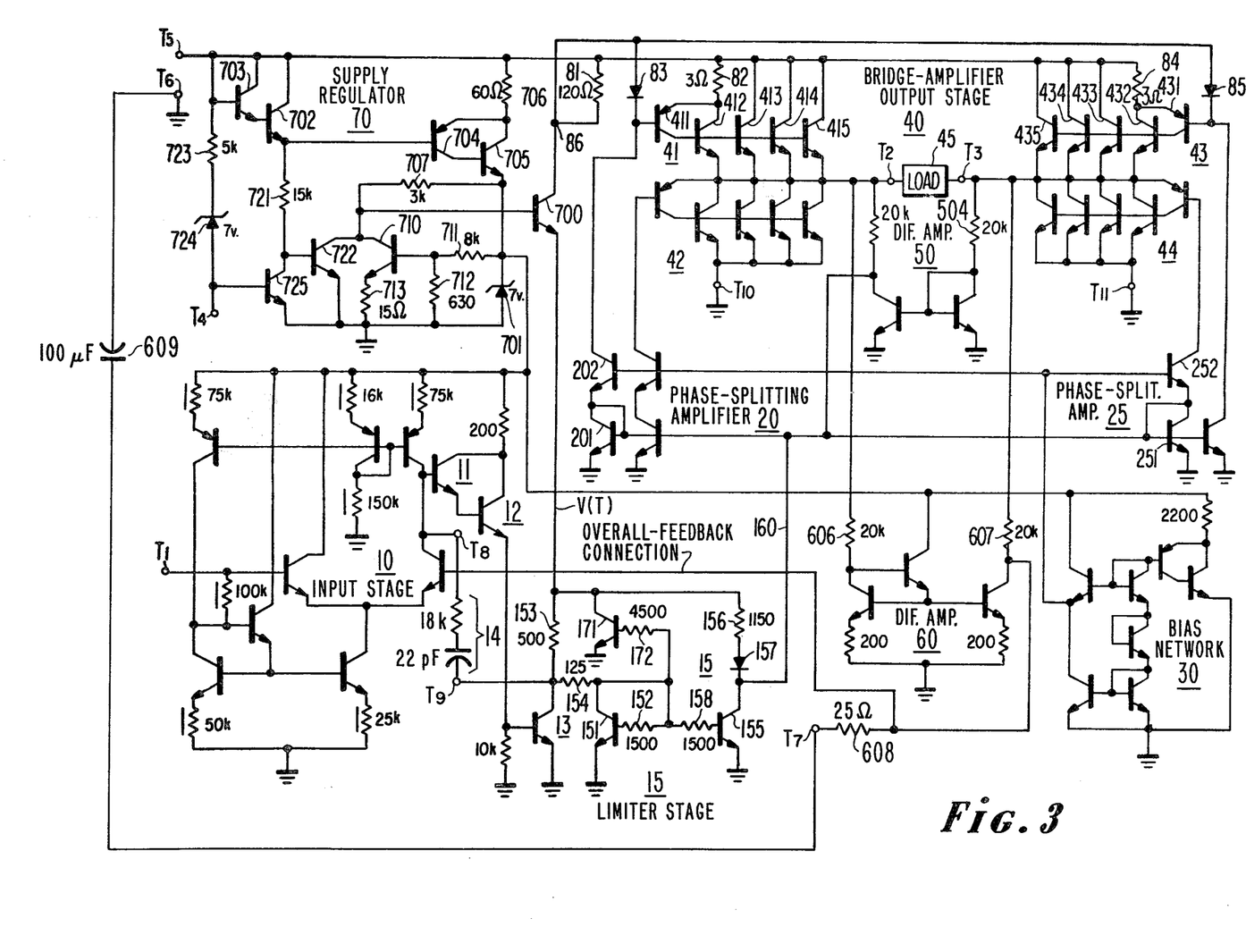
FIG. 3 is a schematic diagram of an amplifier employing transistor means with over-current protection afforded according to the present invention showing specific circuitry for developing the potential responsive to the operating conditions of those transistor means against which the potential in the over-current sensing resistor is to be compared in order to determine if input currents to the transistor means should be curtailed.

FIG. 3 shows an amplifier which except for load 45 (which may be a loudspeaker, for example), the series RC combination connecting terminals $T_8$ and $T_9$, and the by-pass capacitor connecting terminals $T_7$ and $T_6$, is constructed in monolithic integrated circuit form. This amplifier is of interest since it provides a practical example of how the input signal current source 6, the controlled voltage source 7, and the supply potential sensor 72 can be realized.

Resistor symbols which have a bar adjacent to them denote resistors which are preferably fabricated as pinch resistors. Resistors 82 and 84, each shown as being 3 ohms in resistance, preferably are fabricated in the same N+ diffusion process used to provide buried layers or pockets in the collector regions of the NPN transistors. This avoids having to make ohmic contact to the ends of the resistors 82 and 84 connected to the collector electrodes of transistors 412 and 432, respectively. Preferably, resistor 81 should have a resistance tracking that of resistors 82 and 84, so it too is made as a buried layer resistor. Other resistors less than 200 ohms may be made by N+ diffusions at the same time as NPN transistor emitter regions are diffused. All other resistors may be made by P diffusions at the same time as the NPN transistor base regions are diffused. The NPN transistors are most feasibly realized by vertical structures, and the PNP transistors by lateral structures.

The operation of the amplifier will be explained generally to begin with and thereafter in greater detail. Terminals $T_5$ and $T_6$ are adapted to receive positive operating potential (B+) and ground reference potential, respectively. Input signals applied to terminal $T_1$ are successively amplified in an emitter-coupled difference amplifier input stage 10; in common-collector amplifier transistors 11, 12 connected in Darlington cascade and in ground-emitter transistor amplifier 13. The amplified signal currents are applied to a limiting circuit 15 which provides controlled symmetrical peak-to-peak limiting of signal current excursions. The degree of peak-to-peak limiting of signal currents afforded by limiting circuit 15 is controlled as a function of the integrated circuit temperature and the supply potential applied between terminals $T_5$ and $T_6$. This control is exerted responsive to the emitter potential of transistor 700, which in turn is controlled by supply regulation circuitry 70. Supply regulation circuitry 70 also controls the development of the potential across the collector load resistor 81 of transistor 700, thus providing the controlled voltage source regulating the level at which over-current protection is afforded the composite output transistors 41 and 43.

The output signal current from the limiter circuit 15 is divided between the input circuits of phase-splitter amplifiers 20, 25. Each of the phase-splitter amplifiers 20, 25 responds to supply a pair of Class B signals responsive respectively to the absolute value of the positive portion of its input signal current and to the absolute value of the negative portion of its input signal current. These push-pull Class B signals are supplied to the output transistors 41, 42, 43, 44, which are connected in a bridge amplifier configuration 40. The phase-splitter amplifiers 20, 25 are of the type described in my U.S. Pat. No. 3,573,645 issued Apr. 6, 1971, and entitled "PHASE-SPLITTING AMPLIFIER." The phase-splitter amplifiers 20, 25 are biased from the bias network 30 so as to provide quiescent base currents to the composite output transistors 41, 42, 43, 44, which vary inversely with their beta (common-emitter forward current gain). The manner in which this is done is described in my U.S. Pat. No. 3,866,466 issued May 27, 1975; entitled "BIAS CIRCUITRY FOR STACKED TRANSISTOR POWER AMPLIFIER STAGES" and, like this application, assigned to RCA Corporation.

The output transistors 41, 42, 43, 44 as shown are each a composite PNP transistor comprising an input PNP transistor, the base electrode of which forms the effective base electrode of the composite transistor, and a plurality of parallelly connected NPN output transistors, the joined emitter electrodes of which form the effective collector electrode of the composite transistor. The effective emitter electrode of the composite transistor is the point to which the emitter of the input PNP transistor and the collector electrodes of the NPN output transistors are connected. The collector electrode of the PNP transistor is coupled to the base electrode of the NPN output transistors. Each composite transistor (41, 42, 43, 44) behaves as a PNP transistor having an effective beta substantially equal to the beta of its input PNP transistor times the beta of one of its output NPN transistors (presuming the betas of the NPN component transistors to be equal). A composite transistor is used in integrated circuitry to realize a PNP transistor since the NPN component transistor when realized in vertical structure is more economical of area on the integrated-circuit chip and tend to have higher beta than a PNP transistor realized in a lateral structure.

The output composite transistors 41, 43 are each connected in collector-loaded, common-emitter amplifier configuration. Transistors 42, 44 are each connected in emitter-loaded, common-emitter amplifier configuration; their collector electrodes are grounded via terminals $T_{10}$, $T_{11}$, respectively.

Composite transistors 41, 42 are connected in push-pull for signal and are stacked for serial quiescent collector-to-emitter current flow. Composite transistors 43, 44 are similarly connected with each other. The connections of the phase-splitter amplifier 20 to the base electrodes of transistors 41, 42 are such that output signals at a terminal $T_2$ are of opposite sense of swing to the input signals at terminal $T_1$. The connections of the phase-splitter amplifier 25 to the base electrodes of transistors 43, 44 is such that the output signals at a terminal $T_3$ are of the same sense of swing as the input signals at terminal $T_1$.

The anti-phase output signals at terminals $T_2$ and $T_3$ are differentially combined in a difference amplifier 50 to provide a degenerative feedback signal to the input circuits of the phase-splitter amplifiers 20, 25. Thus, local degenerative feedback is provided around the output amplifier stages 41, 42, 43, 44 and the phase-splitter amplifiers 20, 25. The anti-phase output signals at terminals $T_2$ and $T_3$ are differentially combined in a difference amplifier 60 to obtain a degenerative feedback signal applied to the input amplifier stage 10. This provides overall degenerative feedback around the entire FIG. 3 amplifier. This concludes the general description of the FIG. 3 amplifier.

The amplifier is afforded over-current protection in the manner described above in connection with FIGS. 1 and 2.

The base electrode of transistor 411, which is the base electrode of the composite transistor 41 is clamped by means of diode 83 to a temperature dependent potential developed across resistor 81 whenever the emitter current of transistor 41 approaches an excessive value. This restricts the application of further base current to the composite transistor 41 and consequently reduces the availability of increased collector current therefrom.

Composite transistor 43 is protected against excessive collector currents in similar fashion. Elements 431, 432, 433, 434, 435, 84, 85 associated therewith correspond respectively to elements 411, 412, 413, 414, 415, 82, 83 associated with composite transistor 41.

The interconnection of the diodes 83, 85 might be returned to a source of clamping potential having a low source impedance. This is not done in the circuit shown in FIG. 3, however, since it is desired to control the clamping potential applied to this interconnection. The presence of the resistor 81 causes the clamping action at the base electrodes of transistors 41, 43 to yield to substantially large base currents. Such large currents may be applied to these base electrodes from phase-splitting amplifiers 20, 25, when the local or overall feedback loops are disabled, for example. Provision is accordingly made to limit the peak values of these base currents. This limiting is accomplished in stage 15 by limiting the maximum peak-to-peak excursion of signals supplied to the input circuits of phase-splitting amplifiers 20, 25.

This peak-to-peak limiting of input signal currents to the phase-splitter amplifiers 20, 25 is preferably done with essentially perfect symmetry. This affords substantially equal protection of each of the output devices 41, 42, 43, 44 from application of currents so large as to induce second breakdown. At the same time, the undistorted output signal power available from the output stages is maximized for a given amount of protection against second breakdown in the least well protected one of the devices 41, 42, 43, 44.

During periods of non-limiting, the output signal currents from limiter stage 15 are proportional to its input signal currents provided from the collector electrode of transistor 13. The levels at which signal current peaks are limited are controlled in substantially linear proportion to the potential V(T) appearing at the emitter electrode of a control amplifier transistor 700, as will now be described. Transistor 151 obtains its base-emitter biasing from its own collector electrode, a degenerative feedback connection which regulates its collector-to-emitter potential to be equal to a base-emitter offset potential, $V_{BE}$ (about 650 millivolts for a silicon transistor), plus the potential drop caused by the passage of its base current through resistor 152. This latter potential drop is small (about 50 to 100 millivolts) as compared to $V_{BE}$ because the resistance of resistor 152 is chosen suitably small. The potential across the serial combination of resistors 153 and 154 therefore is to good approximation $V(T) - V_{BE}$. The resistance of this serial combination is chosen according to Ohms Law so that in the absence of current flow via the collector electrode of transistor 13, the current flow in the serial combination is substantially twice that desired for the quiescent collector current of transistor 13, which is to be operated as a Class A amplifier.

The quiescent potential on the buss 160, to which the collector electrode of transistor 155 is connected, is constrained to be equal to the base-emitter offset potentials of transistors 201, 251, so the potential across the series combination of resistor 156 and diode 157 can also be expressed to good approximation to be $V(T) - V_{BE}$. The resistance of this series combination is chosen such that current flow therethrough is equal to the quiescent collector current of transistor 13.

When transistor 13 has sufficiently positive signal potential applied to its base electrode to cause its collector current to be substantially twice its quiescent level, current flowing through resistor 153 is diverted from transistor 151. The base emitter potentials of transistors 151, 155 become smaller, reducing their collector-to-emitter conduction substantially to zero. The full current flow through resistor 156, equal to the quiescent collector current of transistor 13 flows via buss 160 to the input circuits of phase-splitter amplifiers 20, 25. This establishes the maximum flow of current to the phase-splitter amplifiers 20, 25.

When transistor 13 has the positive signal potential applied to its base electrode reduced sufficiently to reduce its collector-to-emitter conduction substantially to zero, the collector current of transistor 151 is as heretofore noted twice the quiescent collector current of transistor 13. Since the base electrodes of transistors 151, 155 are similarly biased via equal resistance resistors 152, 158 from the collector electrode of transistor 151, their collector current flows will be alike. (The equal-resistance resistors 152, 158 help to ensure this equality while permitting the transistors 151, 155 to be operated in grounded-emitter amplifier configuration.) The collector current of transistor 155 is now twice the quiescent collector current of transistor 13. The current flow through resistor 156 is only equal to the quiescent collector current of transistor 13. The remaining portion of the collector current of transistor 155, which equals the quiescent current flow of transistor 13, must be withdrawn via buss 160 from the input circuits of the phase-splitter amplifiers 20, 25. This establishes the maximum flow of current from the phase-splitter amplifiers 20, 25, since once transistor 13 is biased out of conduction by reduction of its base-emitter potential, biasing its base electrode more negatively has no effect on the subsequent circuitry.

Signal potential excursions applied to the base electrode of transistor 13, which are insufficiently large to cause the currents in buss 160 to reach their maximum are linearly amplified in the limiting circuitry 15 to appear as signal currents on the buss 160. (The transistor 13, a grounded-emitter amplifier operated Class A, provides collector current variations which are linearly related to its base-emitter potential variations coupled via resistor 154 as input signal current variations to a current mirror amplifier configuration including transistors 151, 155.)

The collector load of the regulator transistor 151 is a tapped resistive load comprising resistors 153, 154. If the collector electrode of transistor 13 is connected directly to that of transistor 151, the collector current variations of transistor 13 operating into the low input impedance offered by diode-connected transistor 151 will not develop appreciably large signal potential variations. Moving the connection of the collector electrode of transistor 13 to a tapped position on the collector load of regulator transistor 151 permits developing potential variations responsive to the variations of the collector current of transistor 13 at terminal $T_9$.

These variations are fed back from terminal $T_9$ to terminal $T_8$ via a series RC network external to the integrated circuit (which RC network might typically comprise: an 18 kilohm resistor and a 22 pf capacitor in series) to provide phase compensation to stabilize the overall feedback loop. The overall feedback loop including input stage 10, common-collector amplifier transistors 11 and 12, grounded emitter amplifier transistor 13, limiting circuitry 15, phase splitter amplifiers 20, 25, output transistors 41–44 and differential amplifier 60 is operated so as to tend to establish the presumed value of quiescent collector current for the transistor 13.

The current levels at which limiting occurs in limiter circuitry 15 are, as herein before noted, substantially linearly proportional to $V(T) - V_{BE}$. So, by controlling the potential $V(T)$ as applied from the emitter electrode of control amplifier transistor 700, these current levels can be adjusted. Such control is exerted by the supply regulator circuitry 70, which also maintains a regulated energizing potential $V_z$ across avalanche diode 701 for application to the input amplifier stage 10 and phase-splitter bias circuitry 30.

A $2V_{BE}$ potential drop from B+ potential as applied to terminal $T_5$ is maintained between the collector and emitter electrodes of transistor 702 which is in a diode-connected Darlington configuration with transistor 703. This potential drop biases the base-emitter circuit of a composite PNP transistor formed from PNP transistor 704 and NPN transistor 705.

A $1V_{BE}$ potential is maintained across the resistor 706 establishing the value of the emitter current of the composite transistor and consequently its substantially similar collector current. This collector current is supplied from the emitter electrode of the NPN transistor 705 to bias the diode 701 into avalanche.

The regulated potential $V_z$ appearing across avalanche diode 701 is coupled via resistor 707 to the base electrode of 700. In the absence of current flow other than the base current of transistor 700 through resistor 707, the voltage $V(T)$ at the emitter electrode of transistor 700 is substantially equal to $V_z$ minus the $V_{BE}$ drop across its base-emitter junction. The collector current of transistor 710 increases as the temperature of the integrated circuit increases beyond a certain threshold as explained hereinafter. The collector current of transistor 710 flows through resistor 707, causing a proportional voltage drop thereacross. Consequently, the base potential of transistor 700 is reduced as temperature rises above the threshold. This potential decreased by the $V_{BE}$ drop across the base-emitter junction of transistor 700 appears as $V(T)$ at its emitter electrode. $V(T)$ is reduced with temperature increase above the threshold, and the levels to which the limiter circuitry 15 limits its output signal current excursions are reduced accordingly.

$V_z$ is applied to serially connected resistors 711, 712 which by resistive potential divider action supply a potential substantially invariant with temperature and equal to 0.5 volt to the base-emitter circuit of transistor 710, which includes a resistor 713. Resistor 713 reduces the transconductance $(g_m)$ of transistor 713 at increasing current levels, thus preventing the possibility of thermal oscillation in the temperature sensing circuitry. For a fixed level of base-emitter potential, the collector current of transistor 710, as for any transistor, will increase markedly as a function of temperature increase beyond a certain threshold temperature. Increased collector current in transistor 710 causes a proportionally increased potential drop across resistor 707. The base potential of control amplifier transistor 700 and its emitter potential $V(T)$ are accordingly reduced. The limiter circuitry 15 responds to reduce the maximum peak-to-peak excursions of its output signal currents.

Since the overall feedback loop acts to reduce the quiescent collector current of transistor 13, under these conditions, the transconductance of transistor 13 is also reduced. This effect acts to reduce the level of output signal currents from the limiter circuitry 15 as well as to restrict their maximum peak-to-peak excursion, although the effect is counteracted in part by the overall electrical feedback.

The diode 157 becomes non-conductive when $V(T)$ falls below $2V_{BE}$. This prevents current being withdrawn via buss 160, from the base-emitter junctions of transistors 202, 252, to unbalance the bridge amplifier configuration 40 by transistors 13, 151, 171 when the emitter electrode of control transistor amplifier 700 no longer presents a low source impedance. This is necessary to prevent feed-through of collector current variations of transistor 13 to the phase-splitter amplifiers when limiter circuit 15 is supposed to reduce its output signal currents to zero. The use of the diode 157 and of a tapped collector load 153, 154 for transistor 151 introduces a problem of tracking the antiphase signal currents withdrawn from the emitter electrode of transistor 700 through resistors 153, 156 so they cancel at all levels of $V(T)$. This cancellation substantially eliminates variation of the emitter current of transistor 700 due to signal. This is desirable since the collector current of transistor 700, directly related to its emitter current is used to establish a direct potential across resistor 81.

The direct potential developed across resistor 81 accordingly is proportional to $V_T$ by the common-emitter amplifier action of transistor 700. As $V(T)$ is reduced with increasing temperature, the potential drop across resistor 81 is decreased. This causes the clamping action of diodes 83 and 85 upon the base electrodes of composite transistors 41 and 43, respectively, to occur for reduced values of over-current. Thus, as temperature increases, the dissipation permitted in transistors 41, 43 during overload conditions is reduced. During application of squelch or low supply voltage, $V(T)$ equaling zero, the diodes 83 and 85 will prevent application of appreciable base currents to composite transistors 41, 43.

The problem of minimizing signal variations in the emitter current of transistor 700 introduced through the use of diode 157 and the tapped collector load for transistor 151 is overcome by inclusion of transistor 171 and resistor 172. Grounded-emitter amplifier transistor 171 has its base electrode coupled via resistor 172 to the collector electrode of transistor 151. The collector current of transistor 171 is supplied to the emitter electrode of transistor 700 and combines with currents drawn through resistors 153, 156 to cancel signal variations in the emitter current of transistor 700 at all levels of $V(T)$ and at all levels of signal currents from the collector electrode of transistor 13.

$V(T)$ is also controlled as a function of B+ potential applied to terminal $T_5$, being substantially zero when B+ dips below 7.5 volts. During such condition, current flows through transistors 702, 703 through resistor 721 to the base emitter junction of transistor 722 biasing it into conduction and clamping the base electrode of control amplifier transistor 700 to ground potential. The base-emitter junction of transistor 700 will not be forward biased. There is no forward bias potential for the base emitter junctions of transistors 151, 155. Diode 157 is reverse biased. The limiter circuit 15 provides no output signal currents to the phase-splitter amplifiers 20, 25. For this condition the biasing of the output stages 41, 42, 43, 44 from phase-splitting amplifiers 20, 25 is regulated by the local feedback loop connection provided by differential amplifier 50.

When B+ potential rises above approximately 7.5 volts, the threshold potential necessary for current flow through the serially connected resistor 723 avalanche diode 724 and the base emitter junction of transistor 725 is exceeded. The forward bias applied to the base emitter junction of transistor 725 clamps the base electrode of transistor 722 to ground. Transistor 722 is thereby rendered non-conductive and no longer acts to cause a potential drop across resistor 707. V(T) is controlled strictly as a function of the collector current of transistor 710, which as heretofore noted varies as a function of temperature.

Terminal $T_4$ permits the base electrode of transistor 725 to be clamped to ground or to a negative potential by means outside the integrated circuit to decouple signal currents from the phase-splitter amplifiers 20, 25 and output amplifier stages 41, 42, 43, 44. This is useful for providing squelch in FM automobile radio receivers, for example.

The assymmetrically conductive devices 83, 85 shown as diodes in FIG. 3 may alternatively comprise the base-emitter junctions of transistors. Their collector electrodes can be connected to receive positive operating potential applied to terminal $T_5$. The effective source impedance presented by resistor 81 to the base electrodes of transistors 411 and 431 for this connection is lowered by the common-emitter forward current gain of these transistors, a factor usually in excess of 30.

While the amplifier shown in FIG. 3 uses a bridge configuration 40 of output amplifier stages, it should be apparent to one skilled in the art that the present invention may be embodied in an amplifier providing only a single-ended output signal. Such an amplifier might comprise, for instance, an amplifier similar to that shown in FIG. 3 but in which there is no phase-splitter amplifier 25. The ends of resistors 504, 607 shown connected to terminal $T_3$ would instead be provided a one-half B+ potential by potential divider means. (This potential should be filtered to keep supply ripple from being applied to the difference amplifiers 50, 60.) Output signals would be provided to a load coupled in series with a coupling capacitor between terminal $T_2$ and ground reference potential.

What is claimed is:

1. An amplifier with over-current protection comprising:
    an input terminal for receiving an input signal current;
    an output terminal for connection to a load;
    a common terminal for connection to an operating potential;
    transistor means having a base electrode connected to said input terminal, having a collector electrode connected to said output terminal, and having an emitter electrode;
    a resistive element connecting the emitter electrode of said transistor means to said common terminal and responsive to the emitter current of said transistor means to develop a potential proportional to that current between said common terminal and said emitter electrode;
    a source providing a potential with reference to said common terminal, which potential is responsive to the temperature of said transistor means so as to decrease with increasing temperature; and
    a unilaterally conductive device connecting said source to the base electrode of said transistor means, the direction of relatively easy conduction through said device being such as to limit the excursion of signal potential appearing responsive to said input signal current between the base electrode of said transistor means and said common terminal.

2. An amplifier with over-current protection as set forth in claim 1 wherein said transistor means is a composite transistor including:
    first and second component transistors of complementary conductivity types, each of said component transistors having base and emitter and collector electrodes, the base electrode of said first component transistor being connected to said input terminal to provide the base electrode of said composite transistor, the collector electrode of said first component transistor being connected to the base electrode of said second component transistor, the emitter electrode of said second component transistor providing the collector electrode of said composite transistor, and the collector electrode of said second component transistor being connected to the emitter electrode of said first component transistor, which provides the emitter electrode of said composite transistor.

3. An amplifier with over-current protection as set forth in claim 2 including at least one further transistor with a base electrode to which the collector electrode of said first component transistor is connected, with an emitter electrode connected to said output terminal, and with a collector electrode connected to said common terminal.

4. An amplifier with over-current protection comprising:
    an input terminal for receiving an input signal current;
    an output terminal for connection to a load;
    a common terminal for connection to an operating potential;
    transistor means having a base electrode connected to said input terminal, having a collector electrode connected to said output terminal, and having an emitter electrode;
    a resistive element with substantially constant resistance connecting the emitter electrode of said transistor means to said common terminal and responsive to the emitter current of said transistor means to develop a potential proportional to that current between said common terminal and said emitter electrode;
    a source providing a potential with reference to said common terminal, which potential is responsive to said operating potential so as to decrease as said operating potential decreases below a threshold potential; and
    a unilaterally conductive device connecting said source to the base electrode of said transistor means, the direction of relatively easy conduction through said device being such as to limit the excursion of signal potential appearing responsive to said input signal current between the base electrode of said transistor means and said common terminal.

5. An amplifier with over-current protection as set forth in claim 4 wherein said transistor means is a composite transistor including:
    first and second component transistors of complementary conductivity types, each of said component transistors having base and emitter and collector electrodes, the base electrode of said first component transistor being connected to said input terminal to provide the base electrode of said composite transistor, the collector electrode of said first component transistor being connected to the base electrode of said second component transistor, the emitter electrode of said second component transistor providing the collector electrode of said composite transistor, and the collector electrode of said second component transistor being connected to the emitter electrode of said first component transistor, which provides the emitter electrode of said composite transistor.

6. An amplifier with over-current protection as set forth in claim 5 including at least one further transistor with a base electrode to which the collector electrode of said first component transistor is connected, with an emitter electrode connected to said output terminal, and with a collector electrode connected to said common terminal.

7. An amplifier with over-current protection comprising:
an input terminal for receiving an input signal current;
an output terminal for connection to a load;
a common terminal for connection to an operating potential;
transistor means having a base electrode connected to said input terminal, having a collector electrode connected to said output terminal, and having an emitter electrode;
a resistive element connecting the emitter electrode of said transistor means to said common terminal and responsive to the emitter current of said transistor means to develop a potential proportional to that current between said common terminal and said emitter electrode;
a source providing a potential with reference to said common terminal, which potential is responsive to said energizing potential so as to decrease as said energizing potential decreases below a threshold potential, and is responsive to the temperature of said transistor means so as to decrease as said temperature increases; and
a first unilaterally conductive device connecting said source to the base electrode of said first transistor means, the direction of relatively easy conduction through said device being such as to limit the excursion of signal potential appearing responsive to said input signal current between the base electrode of said transistor means and said common terminal.

8. An amplifier with over-current protection as set forth in claim 7 wherein said transistor means is a composite transistor including:
first and second component transistors of complementary conductivity types, each of said component transistors having base and emitter and collector electrodes, the base electrode of said first component transistor being connected to said input terminal to provide the base electrode of said composite transistor, the collector electrode of said first component transistor being connected to the base electrode of said second component transistor, the emitter electrode of said second component transistor providing the collector electrode of said composite transistor, and the collector electrode of said second component transistor being connected to the emitter electrode of said first component transistor, which provides the emitter electrode of said composite transistor.

9. An amplifier with over-current protection as set forth in claim 8 including at least one further transistor with a base electrode to which the collector electrode of said first component transistor is connected, with an emitter electrode connected to said output terminal, and with a collector electrode connected to said common terminal.

10. An amplifier with over-current protection comprising:
an input terminal, an output terminal and a common terminal, said output and common terminals for providing an output current responsive to an input current received between said input and common terminals;
a first transistor of a first conductivity type having a base electrode coupled to said input terminal and having an emitter and a collector electrode;
a second transistor of a second conductivity type having a base electrode direct coupled from said first transistor collector electrode, having an emitter electrode direct current conductively coupled to said output terminal, and having a collector electrode to which said first emitter electrode is direct coupled;
means for limiting the range of potential excursions appearing between said first transistor base electrode and said common terminal, which potential excursions occur responsive to said input current;
a resistive element coupling said second transistor collector electrode to said common terminal and proportionally responsive to collector current of said second transistor to develop a potential proportional to that current between said first transistor base electrode and said common terminal; and
at least one further transistor of said second conductivity type having a base electrode direct coupled from said first transistor collector electrode, an emitter electrode direct current conductively coupled to said output terminal, and a collector electrode direct current conductively coupled to said common terminal other than through said resistive element.

11. An amplifier as claimed in claim 10 wherein said means for limiting excursions of potential comprises:
means providing a source of potential offset from said common terminal and
an assymmetrically conductive element coupled between said means for providing a source of offset potential and said first transistor base electrode.

12. An amplifier as claimed in claim 11 wherein said assymmetrically conductive element comprises a semiconductor junction.

13. The combination of:
a composite transistor comprising a plurality of transistors of one conductivity type connected base-to-base, connected emitter-to-emitter to an output terminal, and all except one connected collector-to-collector to an operating voltage terminal, and an input transistor of another conductivity type connected at its collector to all of said bases, at its base to an input signal terminal, and at its emitter to the collector of said one of said plurality of transistors;
a current sensing element connected between said emitter of said input transistor and said operating voltage terminal; and means responsive to the sensing by said element of more than a given level of current for limiting to a given value the potential at said input signal terminal.

14. The combination as set forth in claim 13, wherein said current sensing means comprises a resistor.

15. The combination as set forth in claim 13, further including means coupled to said operating voltage terminal for providing at a second operating voltage terminal a voltage offset with respect thereto; and wherein said means responsive to the sensing by said element of more than a given level of current comprises a diode connected between said second operating voltage terminal and said base electrode of said input transistor, poled to conduct in the forward direction when voltage at said base tends to differ from that at said second operating voltage terminal by more than a given amount.

* * * * *

UNITED STATES PATENT OFFICE
CERTIFICATE OF CORRECTION

PATENT NO. : 3,967,207
DATED : June 29, 1976
INVENTOR(S) : Carl Franklin Wheatley, Jr.

It is certified that error appears in the above-identified patent and that said Letters Patent are hereby corrected as shown below:

In the abstract, lines 1 and 2, "commonemitter" should read
    -- common-emitter --.
Column 1, line 12, "overdissipation" should read
    -- over-dissipation --.
Column 2, line 34, "base, emitter" should read --"base",
    "emitter" --.
Column 2, line 35, "collector" should read -- "collector" --.
Column 2, line 43, "emitter" should read -- "emitter" --.
Column 2, line 46, "collector" should read -- "collector" --.
Column 2, line 49, "base" should read -- "base" --.
Column 2, line 50, "emitter and collector" should read
    -- "emitter" and "collector" --.
Column 2, line 57, "emitter and collector" should read
    -- "emitter" and "collector" --.
Column 3, line 6, "base" should read -- "base" --.
Column 3, line 17, "base" should read -- "base" --.
Column 3, line 20, "emitter" should read --"emitter"--.
Column 3, line 27, "base" should read -- "base" --.
Column 3, line 30, "emitter-to-collector" should read
    -- "emitter"-to-"collector" --.
Column 3, line 33, "emitter-to-collector" should read
    -- "emitter"-to-"collector" --.
Column 3, line 47, "emitter-to-collector" should read
    -- "emitter"-to-"collector" --.
Column 3, line 49, "base" should read -- "base" --.
Column 3, line 53, "emitter-to-collector" should read
    -- "emitter"-to-"collector" --.
Column 4, line 14, "emitter" should read -- "emitter" --.
Column 4, line 16, "emitter" should read -- "emitter" --.
Column 4, line 19, "emitter" should read -- "emitter" --.

UNITED STATES PATENT OFFICE
CERTIFICATE OF CORRECTION

PATENT NO. : 3,967,207

DATED : June 29, 1976

INVENTOR(S) : Carl Franklin Wheatley, Jr.

It is certified that error appears in the above-identified patent and that said Letters Patent are hereby corrected as shown below:

```
Column 4, line 28, "emitter" should read -- "emitter" --.
Column 4, line 44, "emitter" should read -- "emitter" --.
Column 5, line 6 , "pockets" should read -- "pockets" --.
Column 6, line  2, "base" should read -- "base" --.
Column 6, line  5, "collector" should read -- "collector" --.
Column 6, line  6, "emitter" should read -- "emitter" --.
Column 6, line 24, "collector-loaded,common-emitter" should
        read -- "collector-loaded", "common-emitter" --.
Column 6, line 26, "emitter-loaded, common-emitter" should
        read -- "emitter-loaded", "common-emitter" --.
Column 6, line 27, "collector" should read -- "collector" --.
Column 6, lines 30-31, "collector-to-emitter" should read
        -- "collector"-to-"emitter" --.
Column 6, line 34, "base" should read -- "base" --.
Column 6, line 37,"base" should read -- "base" --.
Column 6, line 58, "base" should read -- "base"  --.
Column 6, line 63, "base" should read -- "base" --.
Column 6, line 64, "collector" should read -- "collector" --.
Column 6, line 67, "collector" should read -- "collector" --.
Column 7, line 9,  "base" should read -- "base" --.
Column 7, line 10, "base" should read -- "base" --.
Column 7, line 11, "base" should read -- "base" --.
Column 7, line 14, "base" should read -- "base" --.
Column 9, line 19, "emitter" should read -- "emitter" --.
Column 9, line 21, "collector" (both occurrences) should read
        -- "collector" --.
```

UNITED STATES PATENT OFFICE
CERTIFICATE OF CORRECTION

PATENT NO. : 3,967,207

DATED : June 29, 1976

INVENTOR(S) : Carl Franklin Wheatley, Jr.

It is certified that error appears in the above-identified patent and that said Letters Patent are hereby corrected as shown below:

```
Column 10, line 29, "base" should read -- "base" --.
Column 10, line 36, "base" should read -- "base" --.
Column 11, line 51, "base" should read -- "base" --.
Column 11, line 52, "collector" should read -- "collector" --.
Column 11, line 54, "emitter" should read -- "emitter" --.
Column 11, line 55, "emitter" should read -- "emitter" --.
Column 11, line 57, "emitter" should read -- "emitter" --.
Column 11, line 60, "emitter" should read -- "emitter" --.
Column 11, line 66, "base" should read -- "base" --.
Column 12, line  2, "base" should read -- "base" --.
Column 12, line 13, "base" should read -- "base" --.
Column 12, line 18, "collector" should read -- "collector" --.
Column 12, line 22, "emitter" should read -- "emitter" --.
Column 12, line 38, "base" should read -- "base" --.
Column 12, line 39, "collector" should read -- "collector" --.
Column 12, line 41, "emitter" should read -- "emitter" --.
Column 12, line 43, "emitter" should read -- "emitter" --.
Column 12, line 45, "emitter" should read -- "emitter" --.
Column 12, line 47, "emitter" should read -- "emitter" --.
Column 12, line 55, "base" should read -- "base" --.
Column 12, line 59, "base" should read -- "base" --.
Column 13, line  2, "base" should read -- "base" --.
Column 13, line  7, "collector" should read -- "collector" --.
Column 13, line 11, "emitter" should read -- "emitter" --.
Column 13, line 27, "base" should read -- "base" --.
Column 13, line 28, "collector" should read -- "collector" --.
Column 13, line 30, "emitter" should read -- "emitter" --.
Column 13, line 31, "emitter" should read -- "emitter" --.
Column 13, line 33, "emitter" should read -- "emitter" --.
```

UNITED STATES PATENT OFFICE
CERTIFICATE OF CORRECTION

PATENT NO. : 3,967,207

DATED : June 29, 1976

INVENTOR(S) : Carl Franklin Wheatley, Jr.

It is certified that error appears in the above-identified patent and that said Letters Patent are hereby corrected as shown below:

```
Column 13, line 36, "emitter" should read -- "emitter" --.
Column 13, line 60, "base" should read -- "base" --.
Column 13, line 65, "collector" should read -- "collector" --.
Column 14, line 1, "emitter" should read -- "emitter" --.
```

Signed and Sealed this

Twenty-sixth Day of October 1976

[SEAL]

Attest:

RUTH C. MASON
*Attesting Officer*

C. MARSHALL DANN
*Commissioner of Patents and Trademarks*